US012025682B2

(12) United States Patent
Takasuka et al.

(10) Patent No.: US 12,025,682 B2
(45) Date of Patent: Jul. 2, 2024

(54) MAGNETIC FIELD SENSING DEVICE

(71) Applicants: Kaoru Takasuka, New Taipei (TW); Kang-Shuo Chang, New Taipei (TW)

(72) Inventors: Kaoru Takasuka, New Taipei (TW); Kang-Shuo Chang, New Taipei (TW)

(73) Assignee: iSentek Inc., New Taipei (TW)

(*) Notice: Subject to any disclaimer, the term of this patent is extended or adjusted under 35 U.S.C. 154(b) by 134 days.

(21) Appl. No.: 17/974,556

(22) Filed: Oct. 27, 2022

(65) Prior Publication Data

US 2024/0103099 A1    Mar. 28, 2024

(30) Foreign Application Priority Data

Sep. 22, 2022  (TW) .................................. 111135832

(51) Int. Cl.
*G01R 33/07* (2006.01)
*G01R 33/09* (2006.01)

(52) U.S. Cl.
CPC .............. *G01R 33/07* (2013.01); *G01R 33/09* (2013.01)

(58) Field of Classification Search
CPC .... G01R 33/025; G01R 33/06; G01R 33/063; G01R 33/07; G01R 33/09; G01R 33/093; G01R 33/0206; G01R 33/0052; G01R 33/18; G01N 27/9033; G01N 27/902; G01N 27/9013; G01N 27/904; G01N 27/223; G01N 27/82; G01N 27/9093; G01D 5/145;
(Continued)

(56) References Cited

U.S. PATENT DOCUMENTS 5,701,259 A * 12/1997 Dittrich .................. G01C 17/38
702/92
11,573,072 B2 * 2/2023 Schmitt .................. G01D 5/145
(Continued)

FOREIGN PATENT DOCUMENTS

CN          107144800          9/2017
CN          109791169          5/2019
(Continued)

OTHER PUBLICATIONS

"Office Action of Taiwan Counterpart Application", issued on Jul. 26, 2023, p. 1-p. 7.
(Continued)

*Primary Examiner* — Thang X Le
(74) *Attorney, Agent, or Firm* — JCIPRNET

(57) ABSTRACT

A magnetic field sensing device is provided. The magnetic field sensing device includes a magnetoresistance sensor, a Hall sensor, and a calculating circuit. The magnetoresistance sensor senses a magnetic field to provide a magnetoresistance sensing value. The Hall sensor senses the magnetic field to provide a Hall sensing value. The calculating circuit provides a weight value according to the magnetoresistance sensing value, generates a first calculating value according to the weight value and the Hall sensing value, and generates a second calculating value according to the weight value and the magnetoresistance sensing value. The calculating circuit calculates on the first calculating value, the second calculating value, and the magnetoresistance sensing value to generate an output signal with an output value. The output value is associated with a strength of the magnetic field.

16 Claims, 6 Drawing Sheets

(58) Field of Classification Search
CPC ............ G01D 5/147; G01D 5/12; G01D 5/14; G01D 5/16; G01D 5/165; G01D 5/2457; G01D 5/2013; G01D 5/2046; G01D 5/24476; G01D 5/245

See application file for complete search history.

(56) References Cited

U.S. PATENT DOCUMENTS

| | | |
|---|---|---|
| 2014/0139213 A1 | 5/2014 | Cadugan et al. |
| 2016/0178400 A1* | 6/2016 | Vuillermet ............. G01D 5/145 324/207.22 |
| 2017/0242058 A1 | 8/2017 | Kawanami et al. |
| 2023/0384125 A1* | 11/2023 | Onaka .................. G01D 5/2451 |

FOREIGN PATENT DOCUMENTS

| | | |
|---|---|---|
| CN | 114413749 | 4/2022 |
| CN | 115047384 | 9/2022 |

OTHER PUBLICATIONS

Junfeng Jiang, "CMOS Wide-Bandwidth Magnetic Sensors for Contactless Current Measurements," Delft University of Technology, doctoral thesis, Apr. 2019, pp. 1-153, Available at: https://doi.org/10.4233/uuid:38dfa450-82c2-4b63-92d1-26b2eb3adeed.

* cited by examiner

MAGNETIC FIELD SENSING DEVICE

CROSS-REFERENCE TO RELATED APPLICATION

This application claims the priority benefit of Taiwan application serial no. 111135832, filed on Sep. 22, 2022. The entirety of the above-mentioned patent application is hereby incorporated by reference herein and made a part of this specification.

BACKGROUND

Technical Field

The disclosure relates to a sensing device, and more particularly, to a magnetic field sensing device.

Description of Related Art

A magnetic field sensor may be mainly divided into two types, such as a magnetoresistance sensor and a Hall sensor. Generally speaking, the magnetoresistance sensor may have a high signal-to-noise ratio (SNR) at a low magnetic field strength. However, the magnetoresistance sensor reaches sensing saturation at a high magnetic field strength. Therefore, a maximum magnetoresistance sensing value of the magnetoresistance sensor is limited. A Hall sensing value of the Hall sensor is not limited. However, the Hall sensor may have the lower signal-to-noise ratio at the low magnetic field strength. Therefore, how to provide a magnetic field sensing device suitable for a wide range of the magnetic field strength and having the high signal-to-noise ratio is one of the focuses of research for those skilled in the art.

SUMMARY

The disclosure provides a magnetic field sensing device suitable for a wide range of a magnetic field strength and having a high signal-to-noise ratio.

A magnetic field sensing device in the disclosure includes a magnetoresistance sensor, a Hall sensor, and a calculating circuit. The magnetoresistance sensor senses a magnetic field to provide a magnetoresistance sensing value. The Hall sensor senses the magnetic field to provide a Hall sensing value. The calculating circuit provides a weight value according to the magnetoresistance sensing value, generates a first calculating value according to the weight value and the Hall sensing value, and generates a second calculating value according to the weight value and the magnetoresistance sensing value. The calculating circuit calculates on the first calculating value, the second calculating value, and the magnetoresistance sensing value to generate an output signal with an output value. The output value is associated with a strength of the magnetic field.

Based on the above, the calculating circuit generates the first calculating value according to the weight value and the Hall sensing value and generates the second calculating value according to the weight value and the magnetoresistance sensing value. The calculating circuit calculates on the first calculating value, the second calculating value, and the magnetoresistance sensing value to generate the output signal with the output value. Therefore, the calculating circuit performs a weight calculation on the Hall sensing value and the magnetoresistance sensing value to generate the output value associated with the strength of the magnetic field. In this way, the magnetic field sensing device may be suitable for the wide range of the magnetic field strength and have an advantage of the high signal-to-noise ratio.

In order for the aforementioned features and advantages of the disclosure to be more comprehensible, embodiments accompanied with drawings are described in detail below.

DETAILED DESCRIPTION OF DISCLOSED EMBODIMENTS

Figure 1:
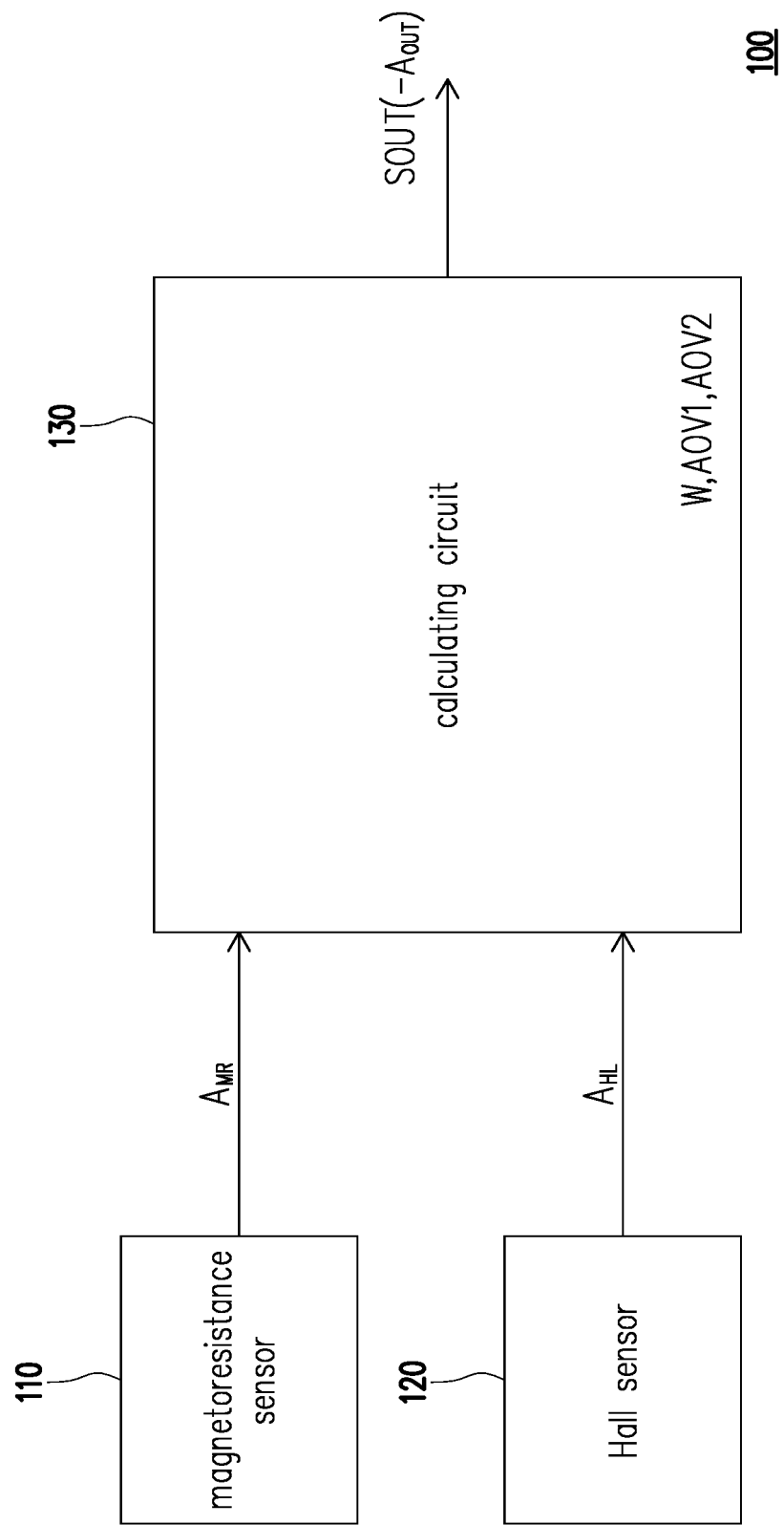
FIG. 1 is a schematic diagram of a magnetic field sensing device according to the first embodiment of the disclosure.

Some embodiments of the disclosure accompanied with the drawings will now be described in detail. In the reference numerals recited in description below, the same reference numerals shown in different drawings will be regarded as the same or similar elements. These embodiments are only a part of the disclosure and do not disclose all possible implementations of the disclosure. To be more precise, these embodiments are only examples of the appended claims of the disclosure.

Referring to FIG. 1, FIG. 1 is a schematic diagram of a magnetic field sensing device according to the first embodiment of the disclosure. In this embodiment, a magnetic field sensing device 100 includes a magnetoresistance sensor 110, a Hall sensor 120, and a calculating circuit 130. The magnetoresistance sensor 110 senses a magnetic field (not shown) to provide a magnetoresistance sensing value $A_{MR}$. The magnetoresistance sensor 110 may be implemented by various types of magnetoresistance sensors known to those skilled in the art. For example, the magnetoresistance sensor is one of an anisotropic magnetoresistance (AMR) sensor, a giant magnetoresistance (GMR) sensor, and a tunnel magnetoresistance (TMR) sensor, but the disclosure is not limited thereto. The Hall sensor 120 senses the magnetic field to provide a Hall sensing value $A_{HL}$. In this embodiment, the Hall sensing value $A_{HL}$ and the magnetoresistance sensing value $A_{MR}$ are respectively voltage values.

In this embodiment, the calculating circuit 130 is coupled to the magnetoresistance sensor 110 and the Hall sensor 120. The calculating circuit 130 provides a weight value W according to the magnetoresistance sensing value $A_{MR}$, generates a first calculating value AOV1 according to the weight value W and the Hall sensing value $A_{HL}$, and generates a second calculating value AOV2 according to the weight value W and the magnetoresistance sensing value $A_{MR}$. The calculating circuit 130 calculates on the first calculating value AOV1, the second calculating value AOV2, and the magnetoresistance sensing value $A_{MR}$ to generate an output signal SOUT with an output value $-A_{OUT}$. In other words, the calculating circuit 130 performs a weight calculation on the magnetoresistance sensing value $A_{MR}$ and the Hall sensing value $A_{HL}$ to generate the output value $-A_{OUT}$ associated with a strength of the magnetic field. In this embodiment, a symbol "−" in the output value $-A_{OUT}$ indicates that the output value $-A_{OUT}$ has a negative correlation with the strength of the magnetic field. In some embodiments, the output value may have a positive correlation with the strength of the magnetic field. The disclosure is not limited thereto.

It is worth mentioning here that the magnetoresistance sensor 110 may have a high signal-to-noise ratio (SNR) at a low magnetic field strength. The Hall sensing value $A_{HL}$ of the Hall sensor 120 may not easily reach sensing saturation at a high magnetic field strength. The calculating circuit 130 provides the weight value W according to the magnetoresistance sensing value $A_{MR}$. The calculating circuit 130 performs the weight calculation on the magnetoresistance sensing value $A_{MR}$ and the Hall sensing value $A_{HL}$ using the weight value W to calculate the output value $-A_{OUT}$. In this way, the magnetic field sensing device 100 may be suitable for a wide range of the magnetic field strength and have an advantage of the high signal-to-noise ratio at the low magnetic field strength.

In this embodiment, the magnetoresistance sensing value $A_{MR}$ is proportional to the weight value W. The calculating circuit 130 provides the weight value W according to the magnetoresistance sensing value $A_{MR}$. The weight value W is greater than or equal to 0 and less than or equal to 1 (i.e., 0≤W≤1). The calculating circuit 130 performs a multiplication calculation on the Hall sensing value $A_{HL}$ and the weight value W to generate the first calculating value AOV1. Therefore, the first calculating value AOV1 is equal to "W×$A_{HL}$". The calculating circuit 130 performs the multiplication calculation on a negative value of the magnetoresistance sensing value $A_{MR}$ and the weight value W to generate the second calculating value AOV2. Therefore, the second calculating value AOV2 is equal to "−W×$A_{MR}$".

Next, the calculating circuit 130 calculates on the first calculating value AOV1, the second calculating value AOV2, and the magnetoresistance sensing value $A_{MR}$ to generate the output signal SOUT with the output value $-A_{OUT}$. Therefore, the output value $-A_{OUT}$ is equal to a negative value of "W×$A_{HL}$−(1−W)×$A_{MR}$".

Figure 2:
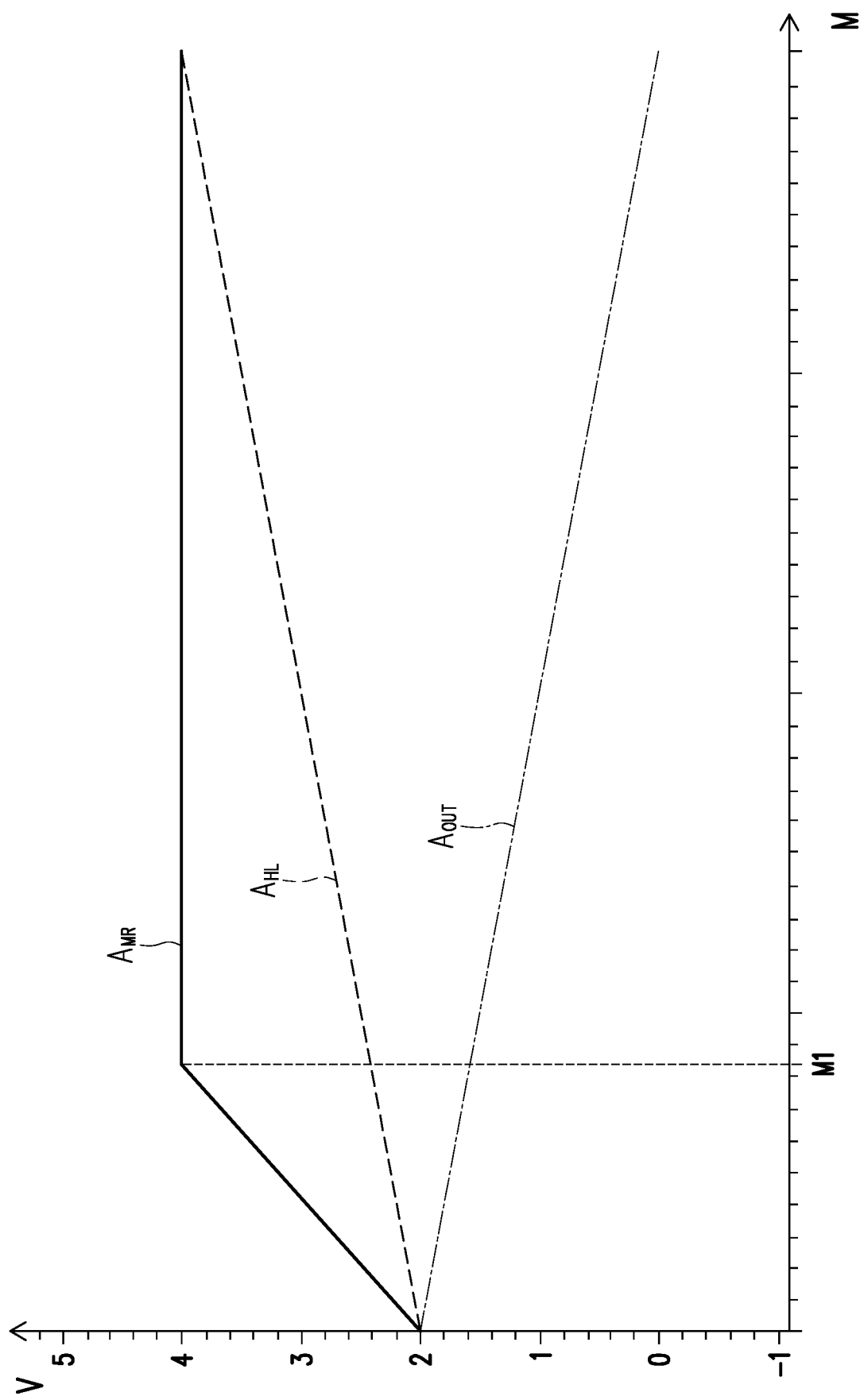
FIG. 2 is a schematic view of a relationship between a Hall sensing value, a magnetoresistance sensing value, and an output value according to an embodiment of the disclosure.

Referring to both FIGS. 1 and 2, FIG. 2 is a schematic view of a relationship between a Hall sensing value, a magnetoresistance sensing value, and an output value according to an embodiment of the disclosure. In this embodiment, the magnetoresistance sensing value $A_{MR}$, the Hall sensing value $A_{HL}$, and the weight value W increase as a magnetic field strength value M increases. When the magnetic field strength value M is relatively low, the magnetoresistance sensing value $A_{MR}$ is higher than the Hall sensing value $A_{HL}$. Therefore, when the magnetic field strength value M of the magnetic field is less than a strength value M1, a weight of the magnetoresistance sensing value $A_{MR}$ (i.e., "1−W") is larger, while a weight of the Hall sensing value $A_{HL}$ (i.e., "W") is smaller. As the strength of the magnetic field increases, the weight of the magnetoresistance sensing value $A_{MR}$ decreases, while the weight (i.e., "W") of the Hall sensing value $A_{HL}$ increases. As the magnetic field strength value M of the magnetic field increases, the output value $-A_{OUT}$ decreases linearly based on the weight value W.

When the magnetic field strength value M of the magnetic field is greater than or equal to the strength value M1, the magnetoresistance sensing value $A_{MR}$ reaches a saturation value (e.g., 4 volts, but the disclosure is not limited thereto). The magnetoresistance sensing value $A_{MR}$ reaches saturation and may not further increase with the strength of the magnetic field. The weight value W is equal to 1. The weight of the magnetoresistance sensing value $A_{MR}$ is equal to 0. The weight of the Hall sensing value $A_{HL}$ is equal to 1. Therefore, the output value $-A_{OUT}$ is equal to a negative value of the Hall sensing value $A_{HL}$. When the magnetic field strength value M of the magnetic field is greater than or equal to the strength value M1, the output value $-A_{OUT}$ continues to decrease linearly based on the Hall sensing value $A_{HL}$.

Figure 3:
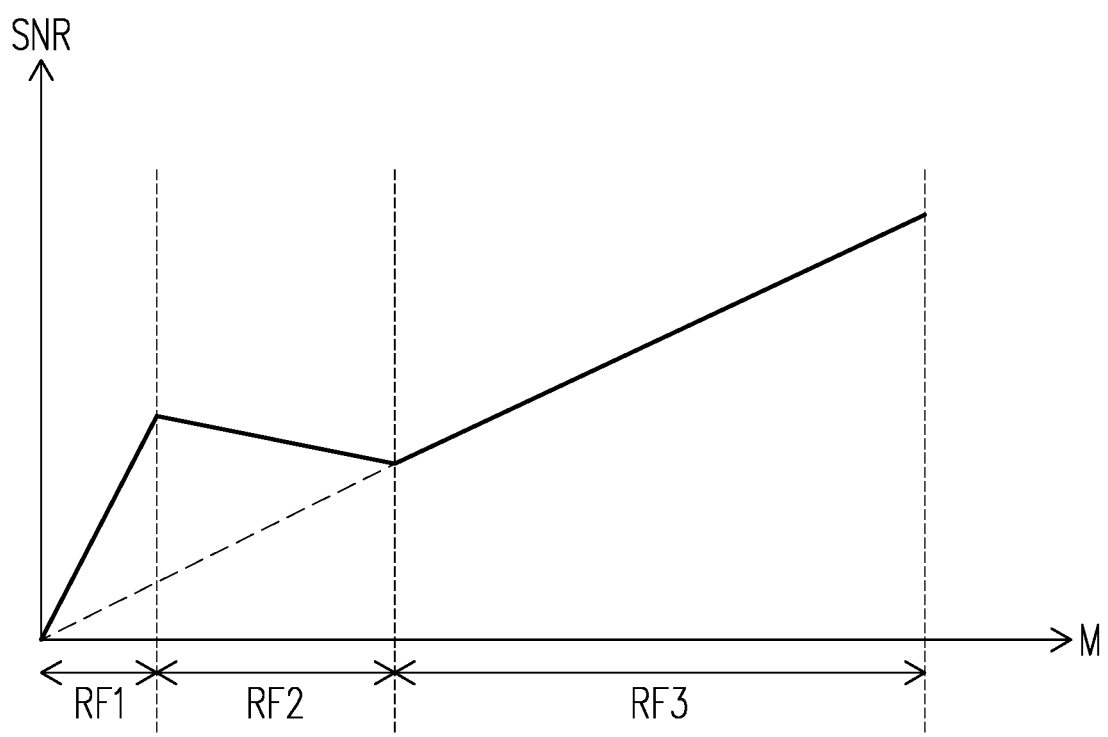
FIG. 3 is a schematic diagram of a relationship between a signal-to-noise ratio and a magnetic field strength according to an embodiment of the disclosure.

Referring to both FIGS. 1 and 3, FIG. 3 is a schematic diagram of a relationship between a signal-to-noise ratio and a magnetic field strength according to an embodiment of the disclosure. In this embodiment, magnetic field strength ranges RF1, RF2, and RF3 are shown. The magnetic field strength in the magnetic field strength range RF3 is higher than the magnetic field strength in the magnetic field strength range RF2. The magnetic field strength in the magnetic field strength range RF2 is higher than the magnetic field strength in the magnetic field strength range RF1. In the magnetic field strength range RF1, the weight of the magnetoresistance sensing value $A_{MR}$ (i.e., "1−W") is larger, while the weight of the Hall sensing value $A_{HL}$ (i.e., "W") is smaller. The magnetoresistance sensing value $A_{MR}$ has a higher signal-to-noise ratio at the magnetic field strength. Therefore, in the magnetic field strength range RF1, a signal-to-noise ratio of the output signal SOUT is greater than a signal-to-noise ratio of the Hall sensor 120 (as shown by the dashed line).

Compared to the magnetic field strength range RF1, the weight of the magnetoresistance sensing value $A_{MR}$ in the magnetic field strength range RF2 is reduced. The weight of the Hall sensing value $A_{HL}$ is increased. Therefore, in the magnetic field strength range RF2, the signal-to-noise ratio of the output signal SOUT gradually decreases as the magnetic field strength value M increases. However, the signal-to-noise ratio of the output signal SOUT is still greater than the signal-to-noise ratio of the Hall sensor 120 (as shown by the dashed line).

Figure 4:
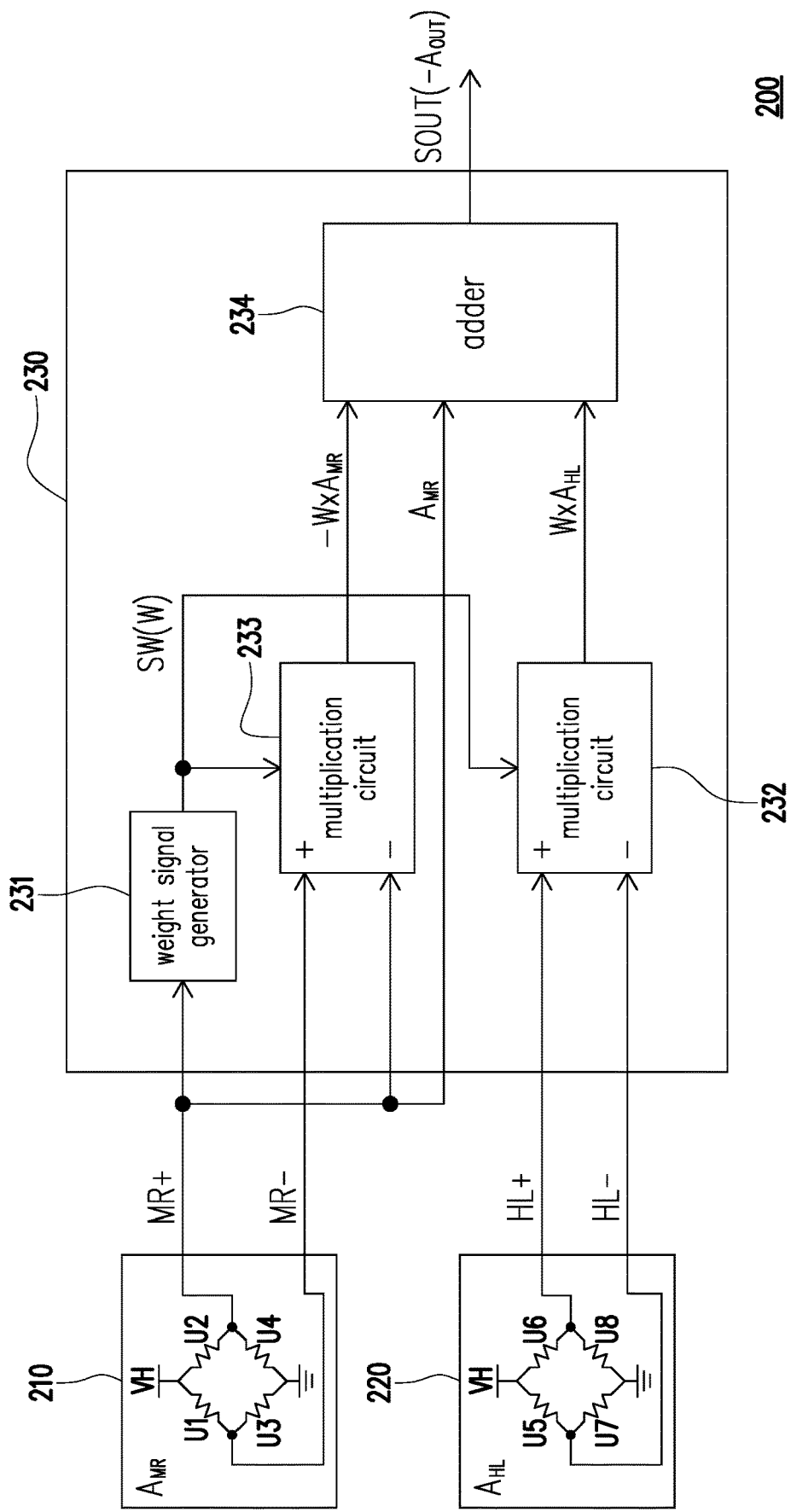
FIG. 4 is a schematic diagram of a magnetic field sensing device according to the second embodiment of the disclosure.

In the magnetic field strength range RF3, the magnetoresistance sensing value $A_{MR}$ reaches the saturation value. The weight of the magnetoresistance sensing value $A_{MR}$ is equal to 0. The weight of the Hall sensing value $A_{HL}$ is equal to 1. Therefore, the signal-to-noise ratio of the output signal SOUT is equal to the signal-to-noise ratio of the hall sensor 120. Referring to FIG. 4, FIG. 4 is a schematic diagram of a magnetic field sensing device according to the second embodiment of the disclosure. In this embodiment, a magnetic field sensing device 200 includes a magnetoresistance sensor 210, a Hall sensor 220, and a calculating circuit 230. The Hall sensor 220 provides a first sensing value HL+ and a first reference value HL−. A difference value between the first sensing value HL+ and the first reference value HL− is equal to the Hall sensing value $A_{HL}$. The magnetoresistance sensor 210 provides a second sensing value MR+ and a second reference value MR−. A difference value between the second sensing value MR+ and the second reference value MR− is equal to the magnetoresistance sensing value $A_{MR}$.

For example, the magnetoresistance sensor 210 and the Hall sensor 220 respectively have multiple magnetic field sensing elements in a bridge structure. The magnetoresistance sensor 210 includes sensing elements U1 to U4. The sensing elements U1 to U4 are connected in the bridge structure. A connection node between the sensing elements U1 and U2 is coupled to a reference voltage source VH. A connection node between the sensing elements U3 and U4 is coupled to a reference low voltage (e.g., ground). A connection node between the sensing elements U2 and U4 is configured to output the second sensing value MR+. A connection node between the sensing elements U1 and U3 is configured to output the second reference value MR−. Therefore, as the magnetic field strength increases, the second sensing value MR+ increases linearly, while the second reference value MR− decreases linearly. The Hall sensor 220 includes sensing elements U5 to U8. The sensing elements U5 to U8 are connected in the bridge structure. A connection node between the sensing elements U5 and U6 is coupled to the reference voltage source VH. A connection node between the sensing elements U7 and U8 is coupled to the reference low voltage. A connection node between the sensing elements U6 and U8 is configured to output the first sensing value HL+. A connection node between the sensing elements U5 and U7 is configured to output the first reference value HL−. Therefore, as the magnetic field strength increases, the first sensing value HL+ increases linearly, while the first reference value HL− decreases linearly.

For another example, the first reference value HL− and the second reference value MR− may be non reference values. Therefore, the first sensing value HL+ is substantially equal to the Hall sensing value $A_{HL}$. The second sensing value MR+ is substantially equal to the magnetoresistance sensing value $A_{MR}$.

In this embodiment, the calculating circuit 230 includes a weight signal generator 231, multiplication circuits 232 and 233, and an adder 234. The weight signal generator 231 is coupled to the magnetoresistance sensor 210. The weight signal generator 231 responds to the first sensing value and generates a weight signal SW with the weight value W. In this embodiment, the weight signal SW is a pulse-width modulation (PWM) signal. The weight value W has a positive correlation with a duty cycle of the weight signal SW. In this embodiment, the weight value W is set to be greater than or equal to 0 and less than or equal to 1 (i.e., 0≤W≤1).

For example, in a single cycle, the weight signal SW has a positive pulse width and a length of time at a low voltage value. The weight value W is substantially equal to a quotient of the positive pulse width divided by the length of time. For another example, the weight value W is substantially equal to the duty cycle of the weight signal SW or an offset value of the duty cycle of the weight signal SW.

The multiplication circuit 232 is coupled to the Hall sensor 220 and the weight signal generator 231. The multiplication circuit 232 performs a first multiplication calculation according to the first sensing value HL+, the first reference value HL−, and the weight value W to generate the first calculating value. The multiplication circuit 233 is coupled to the magnetoresistance sensor 210 and the weight signal generator 231. The multiplication circuit 233 performs a second multiplication calculation according to the second sensing value MR+, the second reference value MR−, and the weight value W to generate the second calculating value. In this embodiment, the first calculating value is equal to "$W \times A_{HL}$". The second calculating value is equal to "$-W \times A_{MR}$".

The adder 234 is coupled to the magnetoresistance sensor 210 and the multiplication circuits 232 and 233. The adder 234 calculates on the first calculating value (i.e., "$W \times A_{HL}$"), the second calculating value (i.e., "$-W \times A_{MR}$"), and the magnetoresistance sensing value $A_{MR}$ to generate the output signal SOUT with the output value $-A_{OUT}$. For example, the adder 234 may be implemented by an inverting adder. Therefore, the output value $-A_{OUT}$ is equal to the negative value of "$W \times A_{HL}+(1-W) \times A_{MR}$".

Figure 5:
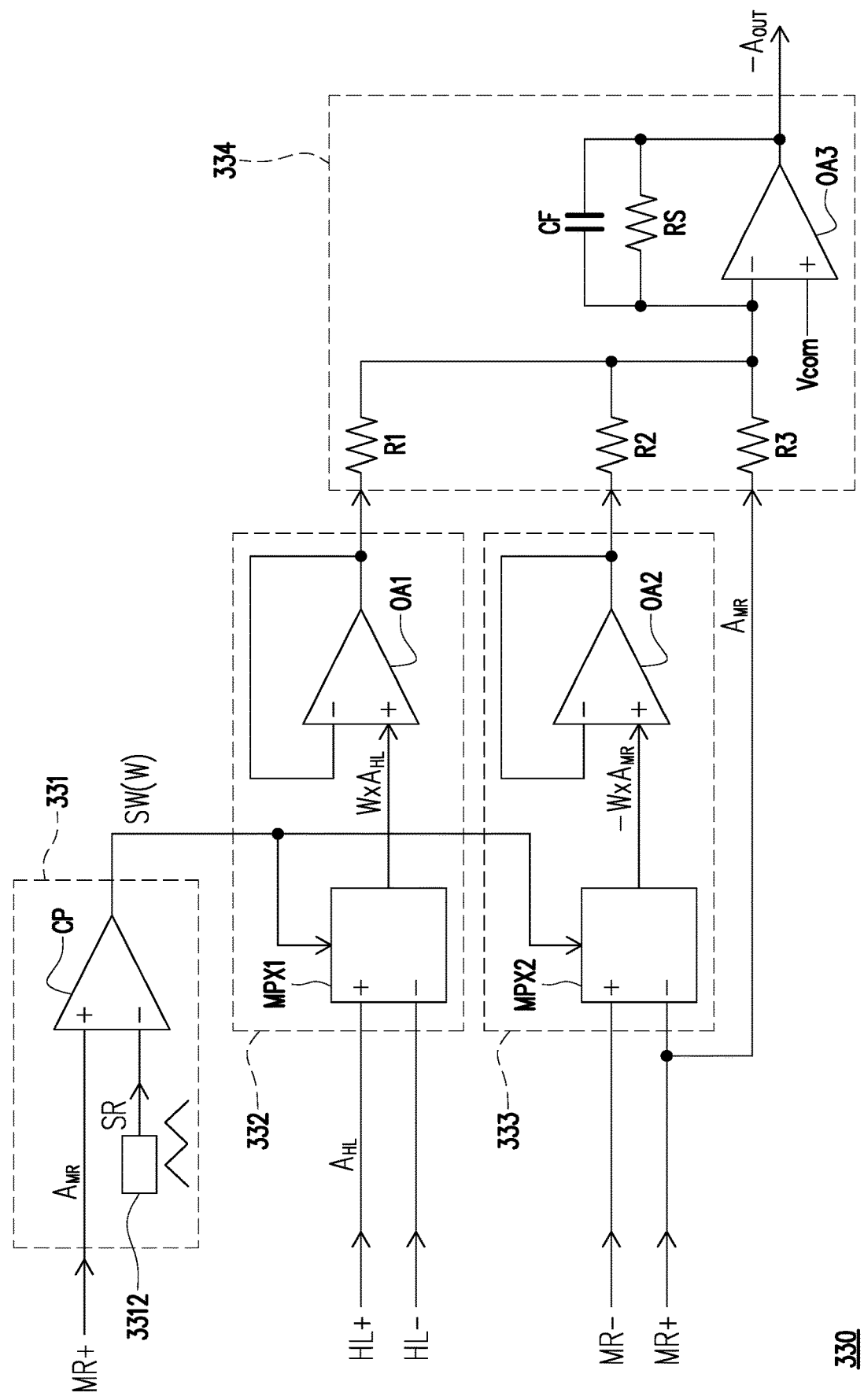
FIG. 5 is a schematic circuit diagram of a calculating circuit according to an embodiment of the disclosure.

Referring to FIG. 5, FIG. 5 is a schematic circuit diagram of a calculating circuit according to an embodiment of the disclosure. In this embodiment, a calculating circuit 330 includes a weight signal generator 331, multiplication circuits 332 and 333, and an adder 334. The weight signal generator 331 includes a comparator CP. A non-inverting input end of the comparator CP receives the second sensing value MR+. An inverting input end of the comparator CP receives a reference triangular wave signal SR. The comparator CP compares the second sensing value MR+ with a voltage value of the reference triangular wave signal SR to generate the weight signal SW.

In this embodiment, the higher the second sensing value MR+ is, the wider the positive pulse width of the weight signal SW is. Therefore, the duty cycle of the weight signal SW is higher. The weight value W is also higher. The lower the second sensing value MR+ is, the narrower the positive pulse width of the weight signal SW is. Therefore, the duty cycle of the weight signal SW is lower. The weight value W is also lower.

In this embodiment, the weight signal generator 331 further includes a triangular wave signal generator 3312. The triangular wave signal generator 3312 transmits the reference triangular wave signal SR to the inverting input end of the comparator CP. In some embodiments, the triangular wave signal generator 3312 may be disposed outside the weight signal generator 331 or outside the calculating circuit 330, and the disclosure is not limited to the configuration of the triangular wave signal generator 3312.

In this embodiment, the multiplication circuit 332 includes a multiplier MPX1. A positive input end of the multiplier MPX1 receives the first sensing value HL+. A negative input end of the multiplier MPX1 receives the first reference value HL−. A control end of the multiplier MPX1 receives the weight signal SW. An output end of the multiplier MPX1 is used to output the first calculating value (i.e., "$W \times A_{HL}$"). In this embodiment, the first calculating value is equal to a product of the weight value W and the first sensing value HL+.

In addition, in order to maintain or improve a signal fan-out capability of the multiplication circuit 332, the multiplication circuit 332 may include a buffer generated by an operational amplifier OA1. In this embodiment, a non-inverting input end of the operational amplifier OA1 is coupled to the output end of the multiplier MPX1 to receive the first calculating value. An inverting input end of the operational amplifier OA1 is coupled to an output end of the operational amplifier OA1. Therefore, the buffer may be a unity-gain buffer. In this embodiment, the multiplication circuit 333 includes a multiplier MPX2. A positive input end of the multiplier MPX2 receives the second reference value MR−. A negative input end of the multiplier MPX2 receives the second sensing value MR+. A control end of the multiplier MPX2 receives the weight signal SW. An output end of the multiplier MPX2 is used to output the second calculating value (i.e., "$-W \times A_{MR}$"). It should be noted that the positive input end of the multiplier MPX2 receives the second reference value MR−. The negative input end of the multiplier MPX2 receives the second sensing value MR+. Therefore, the multiplier MPX2 equivalently receives the negative value of the magnetoresistance sensing value $A_{MR}$. In this embodiment, the second calculating value is equal to a product of the weight value and a negative value of the second sensing value.

In addition, in order to maintain or improve a signal fan-out capability of the multiplication circuit 333, the multiplication circuit 333 may include a buffer generated by an operational amplifier OA2. In this embodiment, a non-inverting input end of the operational amplifier OA2 is coupled to the output end of the multiplier MPX2 to receive the second calculating value. An inverting input end of the operational amplifier OA2 is coupled to the output end of the operational amplifier OA2.

In this embodiment, the adder 334 includes an operational amplifier OA3 and resistors R1, R2, R3, and RS. A non-inverting input end of the operational amplifier OA3 receives a reference voltage Vcom. An output end of the operational amplifier OA3 is used to output the output signal SOUT. The resistor R1 is coupled between the multiplication circuit 332 and an inverting input end of the operational amplifier OA3. The resistor R2 is coupled between the multiplication circuit 333 and the inverting input end of the operational amplifier OA3. A first end of the resistor R3 receives the second sensing value MR+. A second end of the resistor R3 is coupled to the inverting input end of the operational amplifier OA3. The resistor RS is coupled between the inverting input end of the operational amplifier OA3 and the output end of the operational amplifier OA3. Therefore, the inverting input end of the operational amplifier OA3 receives the first calculating value from the multiplication circuit 332 through the resistor R1, the second calculating value from the multiplication circuit 333 through the resistor R2, and the second sensing value MR+ from the magnetoresistance sensor through the resistor R3.

In this embodiment, a resistance value of the resistor R1, a resistance value of the resistor R2, a resistance value of the resistor R3, and a resistance value of the resistor RS are designed to be the same as one another. Therefore, the adder 334 may perform an inverting addition operation on the first calculating value (i.e., "W×$A_{HL}$"), the second calculating value (i.e., "−W×$A_{MR}$"), and the second sensing value MR+ (i.e., "$A_{MR}$") to generate the output value −$A_{OUT}$. That is, the output value −$A_{OUT}$ is equal to the negative value of "W×$A_{HL}$+(1−W)×$A_{MR}$". In some embodiments, the resistance value of the resistor R1, the resistance value of the resistor R2, the resistance value of the resistor R3, and the resistance value of the resistor RS may be adjusted to change the output value −$A_{OUT}$.

In this embodiment, the adder 334 further includes a capacitor CF. The capacitor CF is coupled between the inverting input end of the operational amplifier OA3 and the output end of the operational amplifier OA3. The capacitor CF and the resistor RS are used as filters. A capacitance value of the capacitor CF is used to determine a frequency bandwidth of the filter.

It should also be noted that, in this embodiment, the calculating circuit 330 is not required to perform the calculation of the output value −$A_{OUT}$ through analog-digital conversion. In this way, the calculating circuit 330 may generate the output value −$A_{OUT}$ in real time in response to the first sensing value HL+, the first reference value HL−, the second sensing value MR+, and the second reference value MR−.

Figure 6:
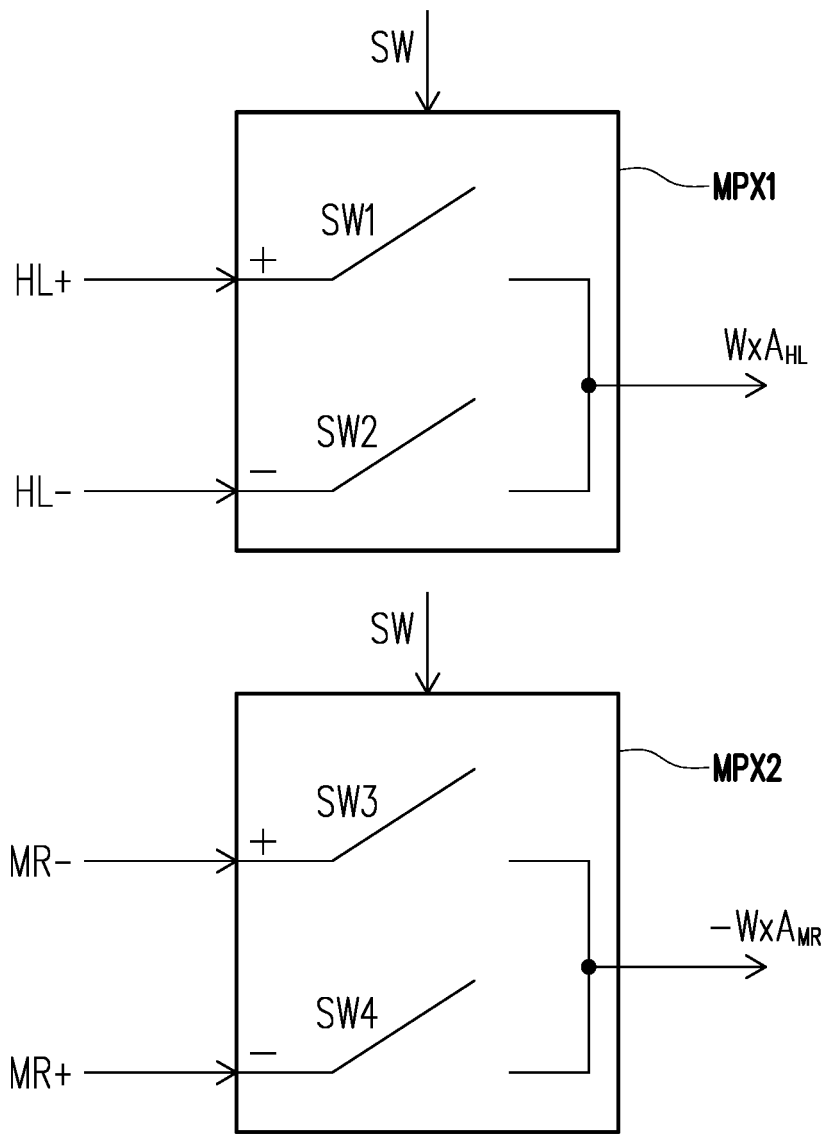
FIG. 6 is a schematic circuit diagram of a multiplier according to an embodiment of the disclosure.

Referring to FIG. 6, FIG. 6 is a schematic circuit diagram of a multiplier according to an embodiment of the disclosure. FIG. 6 shows circuit diagrams of the multipliers MPX1 and MPX2 in FIG. 5. In this embodiment, the multiplier MPX1 includes switches SW1 and SW2. A first end of the switch SW1 is coupled to the positive input end of the multiplier MPX1. The first end of the switch SW1 receives the first sensing value HL+. A second end of the switch SW1 is coupled to the output end of the multiplier MPX1. A control end of the switch SW1 receives the weight signal SW. A first end of the switch SW2 is coupled to the negative input end of the multiplier MPX1. The first end of the switch SW2 receives the first reference value HL−. A second end of the switch SW2 is coupled to the output end of the multiplier MPX1.

A control end of the switch SW2 receives the weight signal SW.

The multiplier MPX2 includes switches SW3 and SW4. A first end of the switch SW3 is coupled to the positive input end of the multiplier MPX2. The first end of switch SW3 receives the second reference value MR−. A second end of the switch SW3 is coupled to the output end of the multiplier MPX2. A control end of the switch SW3 receives the weight signal SW. A first end of the switch SW4 is coupled to the negative input end of the multiplier MPX2. The first end of the switch SW4 receives the second sensing value MR+. A second end of the switch SW4 is coupled to the output end of the multiplier MPX2. A control end of the switch SW4 receives the weight signal SW.

In the multiplier MPX1, the switch SW1 is turned on in response to a positive pulse of the weight signal SW and turned off in response to a low voltage level of the weight signal SW. On the contrary, the switch SW2 is turned off in response to the positive pulse of the weight signal SW and turned on in response to the low voltage level of the weight signal SW. The multiplier MPX1 determines the first calculating value according to a ratio of the first sensing value HL+ passing through the multiplier MPX1. In other words, the output end of the multiplier MPX1 outputs the first calculating value (i.e., "W×$A_{HL}$") according to the duty cycle of the weight signal SW (i.e., the weight value W) and the Hall sensing value $A_{HL}$.

In the multiplier MPX2, the switch SW3 is turned on in response to the positive pulse of the weight signal SW and turned off in response to the low voltage level of the weight signal SW. On the contrary, the switch SW4 is turned off in response to the positive pulse of the weight signal SW and turned on in response to the low voltage level of the weight signal SW. The multiplier MPX2 determines the second calculating value according to a ratio of the second sensing value MR+ passing through the multiplier MPX2. In other words, the output end of the multiplier MPX2 outputs the second calculating value (i.e., "−W×$A_{MR}$") according to the duty cycle of the weight signal SW (i.e., the weight value W) and the negative value of the magnetoresistance sensing value $A_{MR}$.

Based on the above, the magnetoresistance sensor may have the high signal-to-noise ratio at the low magnetic field strength. The Hall sensing value of the hall sensor is not easy to reach the sensing saturation at the high magnetic field strength. The calculating circuit provides the weight value according to the magnetoresistance sensing value. The calculating circuit performs the weight calculation on the Hall sensing value and the magnetoresistance sensing value to generate the output value associated with the strength of the magnetic field. In this way, the magnetic field sensing device may be suitable for the wide range of the magnetic field strength and have the advantage of the high signal-to-noise ratio.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A magnetic field sensing device, comprising
a magnetoresistance sensor configured to sense a magnetic field to provide a magnetoresistance sensing value;
a Hall sensor configured to sense the magnetic field to provide a Hall sensing value; and
a calculating circuit coupled to the magnetoresistance sensor and the Hall sensor and configured to provide a weight value according to the magnetoresistance sensing value, generate a first calculating value according to the weight value and the Hall sensing value, generate a second calculating value according to the weight value and the magnetoresistance sensing value, and perform an addition operation on the first calculating value, the second calculating value, and the magnetoresistance sensing value to generate an output signal with an output value,
wherein the output value is associated with a strength of the magnetic field.

2. The magnetic field sensing device according to claim 1, wherein the magnetoresistance sensor is one of an anisotropic magnetoresistance sensor, a giant magnetoresistance sensor, and a tunnel magnetoresistance sensor.

3. The magnetic field sensing device according to claim 1, wherein the magnetoresistance sensing value is proportional to the weight value.

4. The magnetic field sensing device according to claim 1, wherein
the Hall sensor provides a first sensing value and a first reference value,
a difference value between the first sensing value and the first reference value is equal to the Hall sensing value,
the magnetoresistance sensor provides a second sensing value and a second reference value, and
a difference value between the second sensing value and the second reference value is equal to the magnetoresistance sensing value.

5. The magnetic field sensing device according to claim 4, wherein the calculating circuit comprises:
a weight signal generator coupled to the magnetoresistance sensor and configured to generate a weight signal with the weight value in response to the first sensing value;
a first multiplication circuit coupled to the Hall sensor and the weight signal generator, and configured to perform a first multiplication calculation according to the first sensing value, the first reference value, and the weight value to generate the first calculating value;
a second multiplication circuit coupled to the magnetoresistance sensor and the weight signal generator, and configured to perform a second multiplication calculation according to the second sensing value, the second reference value, and the weight value to generate the second calculating value; and
an adder coupled to the magnetoresistance sensor, the first multiplication circuit, and the second multiplication circuit, and configured to calculate on the first calculating value, the second calculating value, and the magnetoresistance sensing value to generate the output signal with the output value.

6. The magnetic field sensing device according to claim 5, wherein
the weight signal is a pulse-width modulation signal, and the weight value has a positive correlation with a duty cycle of the weight signal.

7. The magnetic field sensing device according to claim 6, wherein the higher the second sensing value is, the higher the duty cycle of the weight signal is.

8. The magnetic field sensing device according to claim 5, wherein the weight signal generator comprises:
a comparator, wherein a non-inverting input end of the comparator receives the second sensing value, and an inverting input end of the comparator receives a reference triangular wave signal,
wherein the comparator compares the second sensing value with a voltage value of the reference triangular wave signal to generate the weight signal.

9. The magnetic field sensing device according to claim 5, wherein the first multiplication circuit comprises:
a first multiplier, wherein a positive input end of the first multiplier receives the first sensing value, a negative input end of the first multiplier receives the first reference value, a control end of the first multiplier receives the weight signal, and an output end of the first multiplier is used to output the first calculating value.

10. The magnetic field sensing device according to claim 9, wherein the second multiplication circuit comprises:
a second multiplier, wherein a positive input end of the second multiplier receives the second reference value, a negative input end of the second multiplier receives the second sensing value, a control end of the second multiplier receives the weight signal, and an output end of the second multiplier is used to output the second calculating value.

11. The magnetic field sensing device according to claim 10, wherein
the first multiplication circuit comprises:
a first switch, wherein a first end of the first switch is coupled to the positive input end of the first multiplier, a second end of the first switch is coupled to the output end of the first multiplier, and a control end of the first switch receives the weight signal; and
a second switch, wherein a first end of the second switch is coupled to the negative input end of the first multiplier, a second end of the second switch is coupled to the output end of the first multiplier, and a control end of the second switch receives the weight signal, and
the second multiplication circuit comprises:
a third switch, wherein a first end of the third switch is coupled to the positive input end of the second multiplier, a second end of the third switch is coupled to the output end of the second multiplier, and a control end of the third switch receives the weight signal; and
a fourth switch, wherein a first end of the fourth switch is coupled to the negative input end of the second multiplier, a second end of the fourth switch is coupled to the output end of the second multiplier, and a control end of the fourth switch receives the weight signal.

12. The magnetic field sensing device according to claim 11, wherein
the first switch and the third switch are turned on in response to a positive pulse of the weight signal and turned off in response to a low voltage level of the weight signal, and the second switch and the fourth switch are turned off in response to the positive pulse of the weight signal and turned on in response to the low voltage level of the weight signal.

13. The magnetic field sensing device according to claim 10, wherein
the first calculating value is equal to a product of the weight value and the first sensing value,
the second calculating value is equal to a product of the weight value and a negative value of the second sensing value, and
the output value is equal to a result of inverting addition of the first calculating value, the second calculating value, and the magnetoresistance sensing value.

14. The magnetic field sensing device according to claim 5, wherein the adder comprises:
an operational amplifier, wherein a non-inverting input end of the operational amplifier receives a reference voltage, and an output end of the operational amplifier is used to output the output signal;
a first resistor coupled between the first multiplication circuit and an inverting input end of the operational amplifier;
a second resistor coupled between the second multiplication circuit and the inverting input end of the operational amplifier;
a third resistor, wherein a first end of the third resistor receives the second sensing value, and the first end of the third resistor is coupled to the inverting input end of the operational amplifier; and
a fourth resistor coupled between the inverting input end of the operational amplifier and the output end of the operational amplifier.

15. The magnetic field sensing device according to claim 13, wherein a resistance value of a first resistor, a resistance value of a second resistor, a resistance value of a third resistor, and a resistance value of a fourth resistor are the same as one another.

16. The magnetic field sensing device according to claim 13, wherein the adder further comprises:
a capacitor coupled between an inverting input end of an operational amplifier and an output end of the operational amplifier.

* * * * *